United States Patent
Rezeq

(10) Patent No.: US 8,563,966 B2
(45) Date of Patent: Oct. 22, 2013

(54) NANO METAL PARTICLES BASED TUNNELING FIELD EFFECT TRANSISTOR AND NANO-SWITCH

(75) Inventor: Moh'd Rezeq, Abu Dhabi (AE)

(73) Assignee: Khalifa University of Science, Technology & Research (KUSTAR), Abu Dhabi (UA)

( * ) Notice: Subject to any disclaimer, the term of this patent is extended or adjusted under 35 U.S.C. 154(b) by 0 days.

(21) Appl. No.: 13/340,804

(22) Filed: Dec. 30, 2011

(65) Prior Publication Data

US 2013/0168641 A1    Jul. 4, 2013

(51) Int. Cl.
*H01L 29/06* (2006.01)
*H01L 21/335* (2006.01)

(52) U.S. Cl.
USPC ............. 257/39; 257/E43.001; 257/E43.003; 438/142; 977/936

(58) Field of Classification Search
CPC  B82Y 10/00; H01L 29/785; H01L 29/78696; H01L 21/26513; H01L 21/266; H91L 21/265
USPC ............. 257/39, 44, 612, E43.001, E43.003; 438/142, 197, 514; 977/873, 832, 936
See application file for complete search history.

(56) References Cited

U.S. PATENT DOCUMENTS

| | | | |
|---|---|---|---|
| 5,746,826 A * | 5/1998 | Hasegawa et al. | 117/90 |
| 2004/0002202 A1 * | 1/2004 | Horsky et al. | 438/515 |
| 2004/0065826 A1 * | 4/2004 | Berger et al. | 250/310 |
| 2004/0121567 A1 * | 6/2004 | Kanayama et al. | 438/515 |
| 2005/0162958 A1 * | 7/2005 | Chae et al. | 365/222 |
| 2006/0139842 A1 * | 6/2006 | Shim et al. | 361/160 |
| 2006/0246467 A1 * | 11/2006 | Wade et al. | 435/6 |
| 2010/0078723 A1 * | 4/2010 | Bertin et al. | 257/350 |

OTHER PUBLICATIONS

Binh et al. "Nanotips and naomagnetism", 1998, Applied Surface Science, vol. 130-132, pp. 803-814, Jun. 1998.*
Xirouchali et al., "Deposition of size-selected metal clusters generated by magnetron sputtering and gas condensation: a progress review", 2004, Phil. Trans. R. Soc. Lond. A vol. 362, pp. 117-124, Nov. 2003.*
Clerc, "Mechanical hardness:...", 1998, Journal of Material Science letters, vol. 17, pp. 1461-1462, Dec. 1998.*

* cited by examiner

*Primary Examiner* — Nikolay Yushin
(74) *Attorney, Agent, or Firm* — Renner, Otto, Boisselle & Sklar, LLP

(57) ABSTRACT

A new devices structure of nano tunneling field effect transistor based on nano metal particles is introduced. The nano semiconductor device, comprising a source and a drain, wherein each of the source and drain comprise an implanted nano cluster of metal atoms, wherein the implanted nano cluster of metal atoms forming the source has an average radius in the range from about 1 to about 2 nanometers, and the implanted nano cluster of metal atoms forming the drain has an average radius in the range from about 2 to about 4 nanometers. Processes for producing the nano semiconductor device are detailed.

22 Claims, 8 Drawing Sheets

NANO METAL PARTICLES BASED TUNNELING FIELD EFFECT TRANSISTOR AND NANO-SWITCH

FIELD OF THE INVENTION

The present invention relates to nanotechnology and to tunneling field effect transistors for use in nano-semiconductor devices and to methods of fabricating such devices, and more particularly to nano metal particles based tunneling field effect transistors and to method of fabricating such devices.

BACKGROUND OF THE INVENTION

There is a growing worldwide interest in down-scaling basic electronic semiconductor devices to the nano range for meeting practical demands, such as power saving, building smaller integrated devices and obtaining optimum high speed. The tunneling field effect transistor (TFET), in particular, has received tremendous attention due to its potential to address power concerns in nano-electronics. This is attributed to the tunneling transmission process of electrons, i.e., a "cold" transmission process, rather than the thermionic process as in conventional MOSFET transistors. However, reducing the size of conventional CMOS electronic devices is limited by the depletion width of various doped (source and drain) terminals and the gate leakage current. Furthermore, the band to band tunneling limits the performance of such devices. The recent attempts of using an atomically thin graphene layer as transport channel are also encountering a problem from the absence of defined band structures which is not preferred in digital electronics.

In fact, the most recent improvement in device scaling has been announced by Intel for reaching the limit of 22 nm in the 3-D Tri-Gate Transistor Technology [1].

SUMMARY OF THE INVENTION

However, the physical investigations of nano metal-semiconductor Schottky contacts can lead to a breakthrough in the efforts of scaling CMOS devices. It has been demonstrated that when the size of the metal-semiconductor contact is less than the conventional characteristic length, which depends on the dopant concentration in the semiconductor side, the new depletion width is no longer a function of the doping level but it is rather a function of the contact size [2,3]. The barrier, in this regime, becomes very shallow due to the condensation of charges in the nano-metal particle which results in a high electric field at the interface. This barrier becomes even thinner when a negative bias is applied at the source to a point where electrons can readily tunnel into the semiconductor side. Such contacts allow much higher current, which increases exponentially with the applied voltage, in the reverse bias than that in the forward bias. Thus this nano device exhibits a reversed behavior compared to the conventional metal-semiconductor contacts. Such fine contacts can be achieved and investigated by a STM tip approaching a Si substrate in an ultra high vacuum system, or by depositing nano metal particles on the semiconductor substrate.

The present invention meets the need for minimum energy electronic systems. As is known, minimizing the energy consumption in electronic devices requires a minimum device size and a solution for the gate leakage current problem. However, conventionally, scaling down the device size is limited by physical effects that result from the overlapping of the depletion regions of successive semiconductor junctions.

The present invention overcomes the size limitation issue by introducing a new approach that utilizes the physical characteristics of nano-size metal-semiconductor contacts. It has been found that when a nano metal particle is in contact with a moderately doped (e.g., dopant concentrations ($N_D$) in the range of about $10^{16}$ cm$^{-3}$) or low doped semiconductor substrate, the barrier thickness becomes extremely small, in the range of the radius of the nano particle [2].

The present invention provides a practical nano device, such as a tunneling field effect transistor (TFET) and extends this basic approach to integrated circuits and logic gates. The principle of the nano TFET is disclosed together with examples of how it can be incorporated into integrated logic gates. This technology is expected to be important to the semiconductor industry for the following physical reasons: First, the electron transmission process is based on the tunneling effect, and hence cold transmission. Second, the fabrication process only requires implanting nano metal particles in a single type (n-doped) Si substrate or intrinsic semiconductor. Third, the resulting device is quite small, e.g., 1-3 nm source and drain radii (in which the drain may be slightly larger than the source), source/drain separation 5 nm or less. Fourth, the device will undergo only minimum loss of energy due to the small size of the device and low operational voltages. Fifth, the device allows a high switching speed.

Thus, in one embodiment, the present invention relates to a nano semiconductor device, including a source and a drain, wherein each of the source and drain comprise an implanted nano cluster of metal atoms, wherein the implanted nano cluster of metal atoms forming the source has an average radius in the range from about 1 to about 2 nanometers, and the implanted nano cluster of metal atoms forming the drain has an average radius in about the same range or larger.

In one embodiment, the source and the drain are separated by a distance of about 5 nm or less.

In one embodiment, the device is a nano TFET or a nano-switch.

In one embodiment, the device further includes additional source and/or drain and nano wiring appropriate to form a nano logic gate. The logic gate may be one of an OR logic gate, an AND logic gate, or other types of logic gate or switch for nano electronic circuits.

In one embodiment, the device includes a back normal electrical contact to form a ground for the nano TFET or the nano-switch, and application of a back gate bias to the back normal electrical contact is comprised in operation of the nano-TFET or the nano-switch.

In one embodiment, the semiconductor substrate is n-doped, p-doped or is an intrinsic semiconductor.

In another embodiment, the present invention relates to a process for manufacturing a nano semiconductor device, including providing a moderate or low doped semiconductor substrate; forming on a surface of the doped semiconductor substrate a plurality of nano clusters of metal atoms, wherein the nano clusters of metal atoms have a size in the range from about 1 to about 2 nanometers; forming an indentation in the surface of the doped semiconductor substrate, the indentation having a size dimensioned to receive the nano clusters of metal atoms and to maintain physical contact between the nano clusters and the doped semiconductor substrate; and transporting the nano clusters of metal atoms into the indentation by means of a nanotip probe.

In one embodiment, the nano clusters of metal atoms are deposited on the semiconductor substrate by electron beam evaporation, by DC magnetron sputtering system or by an aerosol nano particle deposition technique.

In one embodiment, the nano clusters of metal atoms are formed on the semiconductor substrate by field evaporation of metal atoms from the nanotip probe.

In one embodiment, forming the indentation is by impact of the nanotip probe on the surface of the semiconductor substrate.

In one embodiment, forming the indentation is by a focused ion beam method.

In one embodiment, the process further includes passivating the surface of the semiconductor substrate by application of a passivating layer comprising oxygen, hydrogen (or molecules containing hydrogen like $C_2H_2$) or nitrogen thereover.

In another embodiment, the present invention relates to a process for manufacturing a nano semiconductor device, including providing a doped semiconductor substrate; forming an indentation in the surface of the doped semiconductor substrate, the indentation having a size dimensioned to receive a nano cluster of metal atoms and to maintain physical contact between the nano cluster and the doped semiconductor substrate; and applying a sufficiently high positive voltage to a nanotip to transport metal atoms from the nanotip into the indentation to form in the indentation a nano cluster comprising the transported metal atoms.

In one embodiment, forming the indentation is by impact of the nanotip probe on the surface of the semiconductor substrate.

In one embodiment, forming the indentation is by a focused ion beam method.

In one embodiment, the process further includes passivating the surface of the semiconductor substrate by application of a passivating layer comprising oxygen, hydrogen or nitrogen thereover.

In another embodiment, the present invention relates to a process for manufacturing a nano semiconductor device, including providing a doped semiconductor substrate; forming on a surface of the doped semiconductor substrate a plurality of nano clusters of metal atoms, wherein the nano clusters of metal atoms have an average radius in the range from about 1 to about 2 nanometers; epitaxially depositing on the surface of the doped semiconductor substrate and around the nano clusters of metal atoms an additional layer of same-doped semiconductor material, to substantially cover the nano clusters of metal atoms.

In one embodiment, the process further includes passivating the surface of the additional layer of same-doped semiconductor material by application of a passivating layer comprising oxygen, hydrogen or nitrogen thereover.

In one embodiment, the semiconductor substrate is n-doped, p-doped or is an intrinsic semiconductor.

The foregoing summarizes important features of the present invention, but the scope of the invention is not limited to these features, but is limited only by the scope of the claims appended hereto.

Figure 1A:
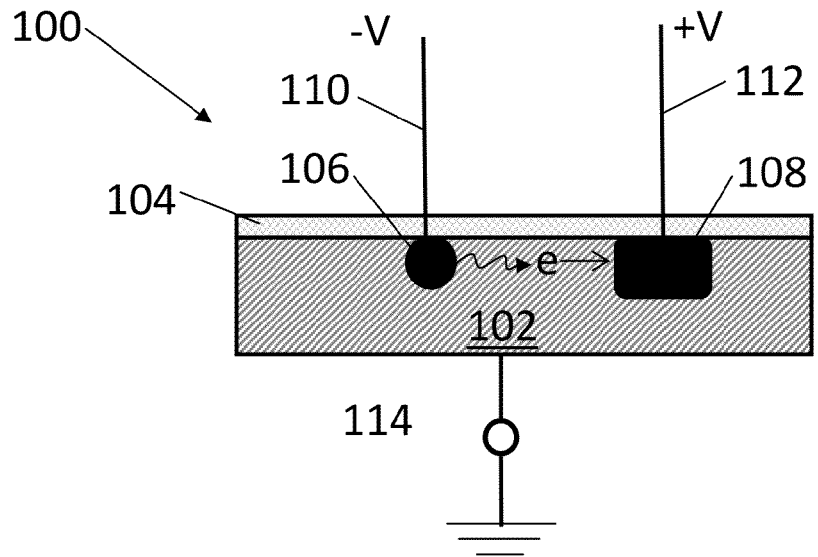
FIG. 1(a) schematically depicts an embodiment of a nano metal tunneling FET in accordance with an embodiment of the present invention.

It is noted that the sizes of elements shown in the drawings, including electrons, ions and tip atoms, may not be to scale.

Furthermore, it should be appreciated that the process steps and structures described below do not form a complete process flow for manufacturing the semiconductor devices, such as nano TFETs, described herein. The present invention can be practiced in conjunction with fabrication techniques currently used in the art, and only so much of the commonly practiced process steps are included as are necessary for an understanding of the present invention.

DETAILED DESCRIPTION OF THE INVENTION

The present inventor's approach to fabricating a nano TEFT utilizes the properties of nano metal semiconductor junctions by implanting nano clusters or nano particles of metal atoms in the surface of a single n-doped silicon (Si) substrate. Instead of having the source, bulk and drain with alternating dopants, in the present invention the source and drain are made of nano clusters of metal atoms, implanted into the doped semiconductor substrate. In the present invention, the source will be about 1-2 nm in average radius and the drain may be of the same size or slightly larger, e.g., about 3-4 nm in radius.

FIG. 1(a) schematically depicts an embodiment of a nano metal tunneling FET 100 in accordance with an embodiment of the present invention. As shown in FIG. 1, the nano metal TFET 100 includes a semiconductor substrate 102, e.g., a moderate or low n-doped silicon semiconductor, or other semiconductors having similar energy band structure, over which has been deposited a layer 104 of a passivating material, such as a dielectric material, for example, silicon dioxide ("oxide"). Implanted in the substrate 102 is a first nano cluster of metal atoms 106 forming a source, and a second nano cluster of metal atoms 108 forming a drain. The first nano cluster of metal atoms 106 has an average radius in the range from about 1 to about 2 nanometers (nm). The second nano cluster of metal atoms 108 has a size in the range from about 2 to about 4 nm. Herein, the first nano cluster of metal atoms 106 may be simply referred to as the source 106, and the second nano cluster of metal atoms 108 may be simply referred to as the drain 108, with the understanding that each consists of a nano cluster of metal atoms as described herein. The distance between the source 106 and the drain 108 is about 5 nm, or is in the range from about 3 to about 7 nm. As depicted in FIG. 1(a), the device 100 further includes a first electrical connector 110 which provides voltage to the source 106 and a second electrical connector 112 which provides voltage to the drain 108. As depicted in FIG. 1(a) the first electrical connector 110 provides a negative voltage to the source 106, while the second electrical connector 112 provides a positive voltage to the drain 108. As depicted in FIG. 1(a), the device 100 further includes a gate bias back contact 114. The gate is formed by normal electrical contact between the back of the substrate and the ground via the contact 114. As shown in FIG. 1(a), the source 106 is negatively biased (−V) and the drain is positively biased (+V) with respect to the ground, when the substrate is n-doped or n-type. As will be understood, the bias on the source and drain need not be the same. As will be understood, electrons tunnel from the source into the substrate and thence flow into the drain. The gate negative bias is used to control and regulate the flow of electrons from the source to the drain, and thus to regulate the electric current. The gate bias can be used to turn off the current, thus converting the device into a nano switch.

Regarding the layer 104 of a passivating material, as is known in the art, on the clean surface of a semiconductor (e.g., Si) substrate, the periodicity of the crystal is often disturbed where surface atoms have unpaired electrons (referred to as free radicals or dangling bonds), as a result these surface atoms are eager to react with any other atoms or molecules on the surface. Most often the surface is passivated intentionally with insulator materials like reactive forms of nitrogen, to form $Si_3N_4$, or oxygen, to form $SiO_2$, or hydrogen, to form H—Si at the surface. As in known in the art, there are two conventional methods of passivating a semiconductor surface. A first method is to deposit a layer that is a few nanometers of either native oxide ($SiO_2$), obtained by methods such as thermal or plasma oxidation, anodization or epitaxy, as well as passivation by deposition of a layer such as silicon nitride. The second method is modification of the atomic structure of the surface by foreign atoms which changes the electronic structure of the semiconductor surface, such as hydrogen or molecules containing hydrogen. Oxygen also can be used to form a passivation layer of silicon oxide. Other surface passivation methods are known in the art and may be suitably selected.

As will be understood, the semiconductor substrate can be p-doped Si or other p-type semiconductor, where the charge carriers are holes instead of electrons, and the biases on the source and drain would be reversed.

As will be understood, the implanted nano clusters of metal atoms should be in good physical and hence electrical contact with the substrate.

In accordance with the present invention, the size, e.g., average radius, of the source and drain are much smaller than the depletion width of a conventional metal-semiconductor contact. For instance, for n-doped silicon with a dopant concentration $N_D = 1 \times 10^{16}$ cm$^{-3}$ making a contact with a metal (e.g., gold), the depletion width will be (at room temperature) on the order of about 100 nm. Thus, the drain and source radii (e.g., about 1-3 nm) are much smaller than this conventional depletion width, which means that the potential gradient, hence the electric field, inside the semiconductor will be dominated by the nano particles of the source and drain.

The conventional depletion width $W_D$, at zero applied voltage, is given by equation (1):

$$W_D = \sqrt{\frac{2\varepsilon_s}{eN_D}\left(V_{bi} - \frac{kT}{e}\right)} \quad (1)$$

where $V_{bi}$ is the built-in potential at the metal-semiconductor interface, $\upsilon_s$ is the permittivity of Si, e is electron charge, T is the temperature in Kelvin, and k is the Boltzmann constant. See Ref. [4], page 137.

Therefore, the nano tunneling FET made in accordance with the present invention avoids the technical complexities that arise from arranging various dopant atoms in a very small area. The process of operating this transistor is based on the tunneling effect of electrons from the nano metal source into the semiconductor when the source is negatively biased with respect to the substrate. Whereas the drain has a positive bias (i.e. forward bias) with respect to the semiconductor bulk.

Figure 1B:
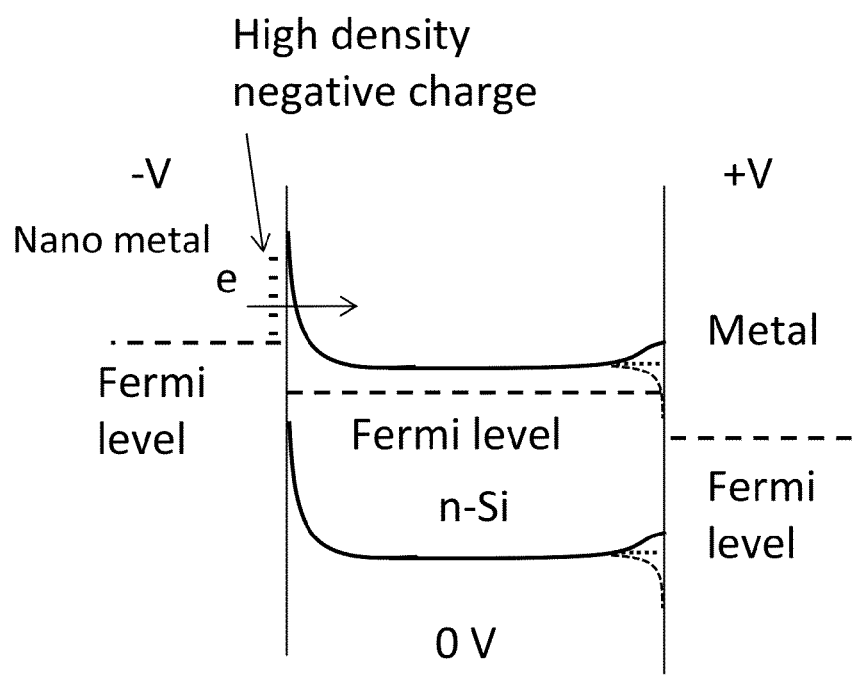
FIG. 1(b) schematically depicts the energy band diagram in the operation mode of a source and drain composed of nano clusters of metal atoms in accordance with an embodiment of the present invention.

FIG. 1(b) schematically depicts the energy band diagram in the operation mode of a source and drain composed of nano clusters of metal atoms in accordance with an embodiment of the present invention. The barrier, in the nano source side, becomes very thin in the reverse bias and electrons can readily tunnel to the Si conduction band. Meanwhile, the positive (forward) bias on the drain will lower the potential barrier and thus allow electrons to flow smoothly. This current flow can be regulated and even switched off by the back (gate) bias, which in turn regulates the barrier width at the metal-semiconductor interface. Therefore, this device can also be turned into a nano-switch.

Next are shown two examples (FIGS. 2 and 3) of how the nano tunneling transistor in accordance with the present invention can be extended to integrated nano logic gates. Note, here the back contact is not required.

Figure 2:
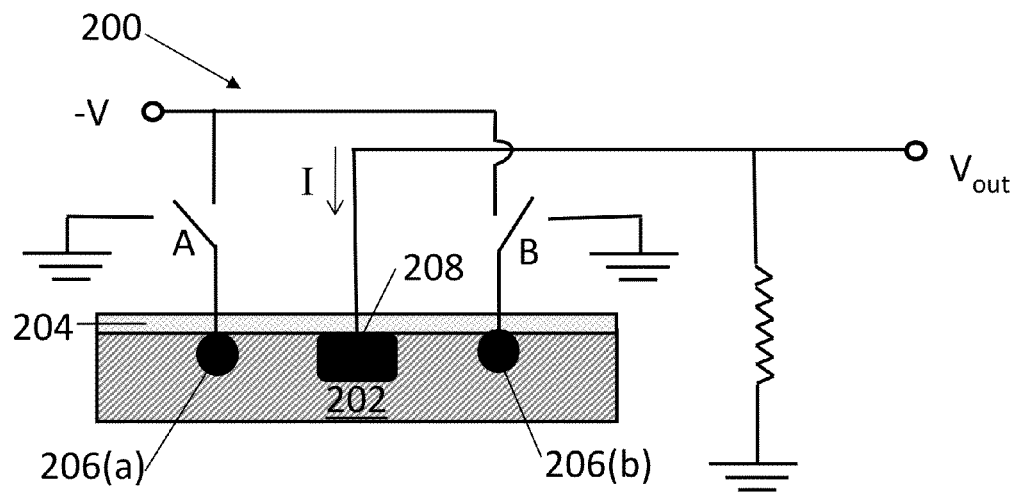
FIG. 2 is a schematic depiction of an "OR" logic gate comprised of nano clusters of metal atoms in accordance with an embodiment of the present invention.

FIG. 2 is a schematic depiction of an "OR" logic gate device 200 comprised of nano clusters of metal atoms in accordance with an embodiment of the present invention. The device 200 shown in FIG. 2 includes a semiconductor substrate 202 (n-doped), a passivation layer 204, a nano cluster of metal atoms forming a first source 206(a), a nano cluster of metal atoms forming a second source 206(b), a nano cluster of metal atoms forming a drain 208, and appropriate electrical connections to create an "OR" gate, as will be understood by those skilled in the art, so detailed explanation is not included for sake of brevity. As shown in FIG. 2, when switch A or switch B, or both, are connected to the −V voltage, the M-S junctions are reversely biased (operational tunneling mode), there is an output voltage. When switch A and switch B are connected to ground, then the current I=0 and $V_{out}$=0. Note the direction of current I is taken in the opposite direction of electron flow.

Figure 3:
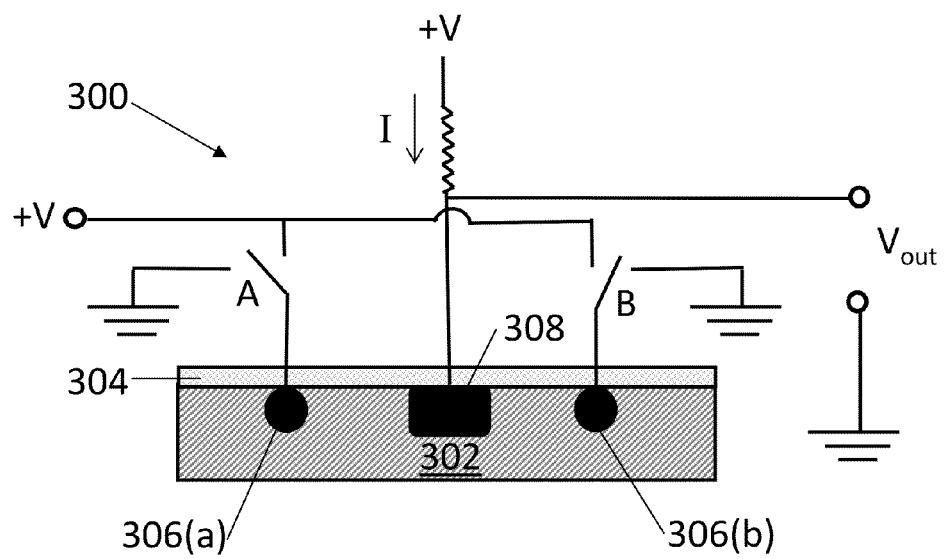
FIG. 3 is a schematic depiction of an "AND" logic gate comprised of nano clusters of metal atoms in accordance with an embodiment of the present invention.

FIG. 3 is a schematic depiction of an "AND" logic gate comprised of nano clusters of metal atoms in accordance with an embodiment of the present invention. The device 300 shown in FIG. 3 includes a semiconductor substrate 302 (n-doped), a passivation layer 304, a nano cluster of metal atoms forming a first source 306(a), a nano cluster of metal atoms forming a second source 306(b), a nano cluster of metal atoms forming a drain 308, and appropriate electrical connections to create an "AND" gate, as will be understood by those skilled in the art, so detailed explanation is not included for sake of brevity. As shown in FIG. 3, only when both A and B are connected to +V the current I=0 and therefore $V_{out}$=+V. When A or B or both are connected ground, the M-S junctions are reversely biased (operational tunneling mode), thus $V_{out}$=0. Note the direction of current I is taken in the opposite direction of current flow.

Figure 4:
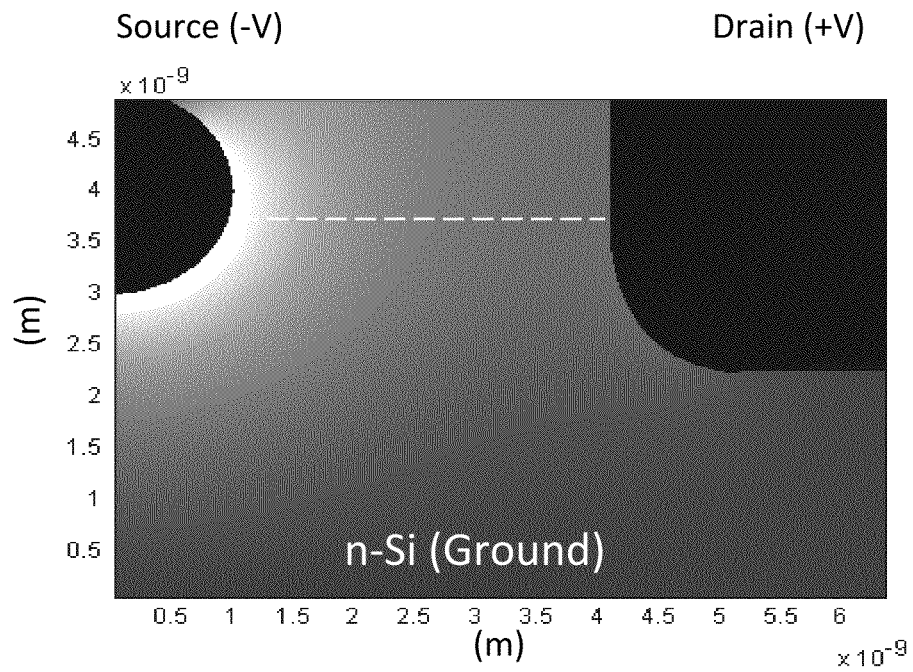
FIG. 4 is a finite element simulation model for a nano TFET in accordance with the present invention.
Figure 5:
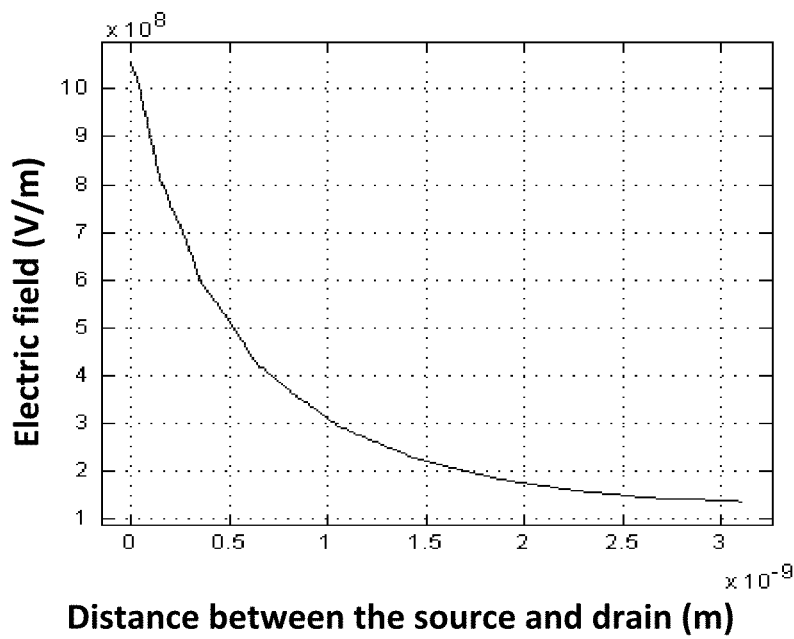
FIG. 5 is a graphical data representation of the electric field profile along the dashed line between the source and drain in FIG. 4.

A numerical modeling software package can be used to build a model for the nano metal TFET. The sizes of the source and drain, and the n-doped substrate are specified to simulate the electric field at the nano metal semiconductor interface, hence the barrier thickness. The simulation for the electric field distribution inside such a device is illustrated in FIGS. 4 and 5. The field at the nano metal-Si interface is 1.05 V/nm, and this field is 4 orders of magnitude higher than that at normal interfaces and quite adequate for electron tunneling.

FIG. 4 is a finite element simulation model for a nano TFET in accordance with the present invention. The nano source radius is 1 nm. The dopant density in the silicon substrate is $N_D=1\times10^{16}$ cm$^{-3}$. The field at the nano-metal silicon interface=1.05 V/nm, which is depicted as the bright area a round the nano source. The applied voltages or the source and drain are −0.2 V and +0.2 V respectively and the substrate is grounded.

FIG. 5 is a graphical data representation of the electric field profile along the dashed line between the source and drain in FIG. 4. In FIG. 5, the electric field is shown on the Y axis in volts per meter (V/m) at a scale from 1-10.5×10$^8$ meter, and the distance between the source and drain is plotted on the X-axis in the range of 0-3×10$^{-9}$ meter. In accordance with the invention, and as noted above, the electric field strength at the interface of the nano cluster of metal atoms forming the source is sufficient for electron tunneling from the source to the drain.

There are several ways to fabricate components of nano TFETs in accordance with the present invention, three of which are briefly described in the following.

In one embodiment, the process includes metal (e.g., gold) atoms or clusters being evaporated and then being deposited, by an e-beam evaporator or deposited by an appropriate aerosol-nanoparticle technique, or deposited by a DC magnetron sputtering system, on a previously prepared n-doped Si substrate in a UHV chamber of a scanning tunneling microscope (STM). Subsequently, the STM tip is used to manipulate these atoms or clusters into the desired configuration within an area of a few nanometers. An indentation in the surface of the Si substrate is formed by intentionally pushing the STM tip against the surface of the substrate prior to the transfer of the nano particles into these indentations. Then the surface of the Si substrate is passivated by hydrogen or oxygen atoms, or other passivation agents, to eliminate the surface dangling bonds and thus avoid any surface leakage current. Multiple STM probes can be used simultaneously in parallel to form multiple contacts with the source and drain of the nano TFET [5,6].

In another embodiment, which may be more precise, the nano TFET can be constructed by a process including direct deposition of metal atoms from the STM tip itself by the field evaporation method, directly into previously-formed indentations in the surface of an appropriately doped semiconductor. In this regard, outstanding technologies for fabricating nanotips with atomic precision [7-10] may be utilized, but not exclusively. For mass production of such nano devices the high resolution focused ion beam on masked (covered with a thin insulator passivation layer) substrates is a powerful method.

In another embodiment, the nano TFET can be constructed by a process including deposition of the clusters of nano particles on a previously prepared n-doped Si substrate or other suitable semiconductor substrate, as described above, and then additional n-doped Si substrate or other semiconductor substrate is epitaxially deposited around the clusters, forming an additional layer of n-doped Si substrate or other semiconductor substrate, to a thickness approximating the size of the cluster. Thereafter, the surface of the Si substrate is passivated by hydrogen, oxygen or other suitable passivation agents to eliminate the surface dangling bonds and thus avoid any surface leakage current, as described above.

Three exemplary processes for depositing nano clusters of metal atoms on a semiconductor surface are briefly described in the following.

Aerosol Nanoparticle Method:

Nanometer-sized aerosol particles of various materials can be produced by an evaporation/condensation method. A solid metal source is heated in a high temperature furnace forming a vapor. The resulting vapor is transported away by a stream of ultra-pure nitrogen gas and condenses into clusters or nanoparticles. The nitrogen carrier gas transports the particles through the rest of the system where they are charged and will then be size selected by a differential mobility analyzer (DMA) that classifies charged particles due to their mobility in an electric field. This method is disclosed by Magnusson, M. H., et al., "Gold nanoparticles: Production, reshaping, and thermal charging", Journal of Nanoparticle Research 1, 243 (1999), which may be consulted for additional details on this process.

Electron Beam Physical Vapor Deposition:

The solid target material (often in a rod form) is directly bombarded by electrons from a current-carrying tungsten filament under high vacuum. The electron beam causes atoms from the target to transform into the gaseous phase. The flux of gaseous atoms is then directed toward the substrate where the atoms precipitate into solid form, as, e.g., a thin film or nano clusters. E-beam evaporators are commercially available and such methods are known in the art.

DC Magnetron Sputtering System:

A DC magnetron is used to sputter target material, like gold. The sputtered atoms then enter a chamber of a high pressure of inert gas (such as Ar) for condensation, where their mean free path becomes very small, causing the sputtered atoms to combine into nano clusters or nano particles. These nano clusters then migrate towards the expansion zone where they obtain an electric charge. This electric charge allows selection (under electric field) and deposition of the nano clusters with controlled desired sizes, e.g., nano clusters with a controlled diameter range of 2 nm to 5 nm can be achieved. Such process is disclosed by Veith, Gabriel M., et al., "Nanoparticles of gold on γ-Al$_2$O$_3$ produced by dc magnetron sputtering", Journal of Catalysis 231, 151 (2005), which may be consulted for additional details on this process. Nano-particle sources using this technique are commercially available.

Figure 6A:
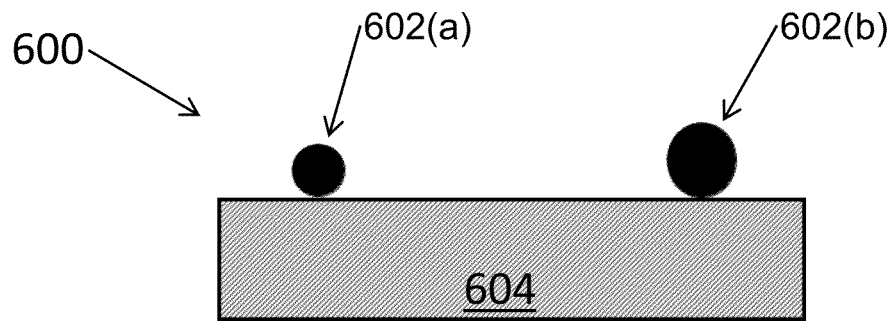
FIGS. 6(a)-6(f) are schematic cross-sectional views of a portion of a method of making a nano device in accordance with an embodiment of the invention.

FIGS. 6(a)-6(f) are schematic cross-sectional views of a portion of a method of making the nano TFET 600 in accordance with an embodiment of the invention. As shown in FIG. 6(a), nano clusters 602(a) and 602(b) of metal atoms are deposited onto the clean surface of a n-doped semiconductor substrate 604, by a suitable method, such as one of those disclosed above. The deposited nano clusters 602(a), 602(b), may have different sizes, as noted above for example, for source and drain, of a nano TFET, for example.

Figure 6B:
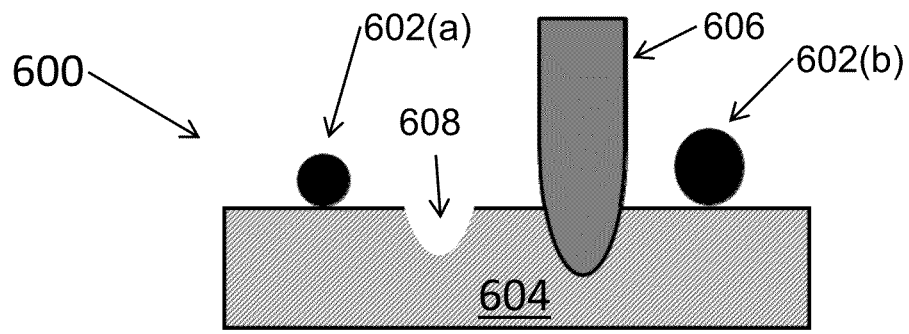

As shown in FIG. 6(b), a nanotip 606 may be used to form an indentation 608 in the surface of the substrate 604. The indentation 608 is essentially mechanically formed by the nanotip 606 being forced into the surface of the substrate 604. The size of the indentation may be controlled by the size and movements of the nanotip, e.g., in depth and width of the indentation.

Figure 6C:
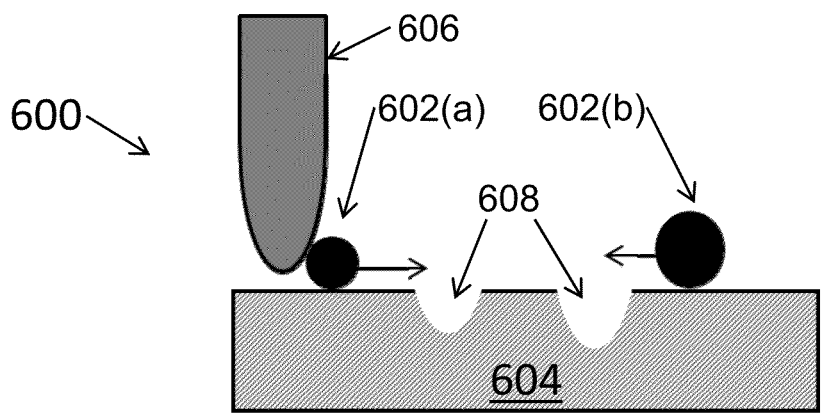

As shown in FIG. 6(c), the nanotip 606 is used to transport the nano clusters 602(a) and 602(b) into the indentations 608.

Figure 6D:
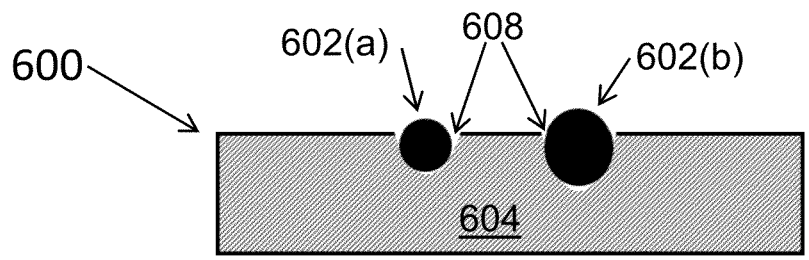

FIG. 6(d) schematically depicts the nano clusters 602(a) and 602(b) after they have been transported into the indentations 608 by the nanotip 606.

Figure 6E:
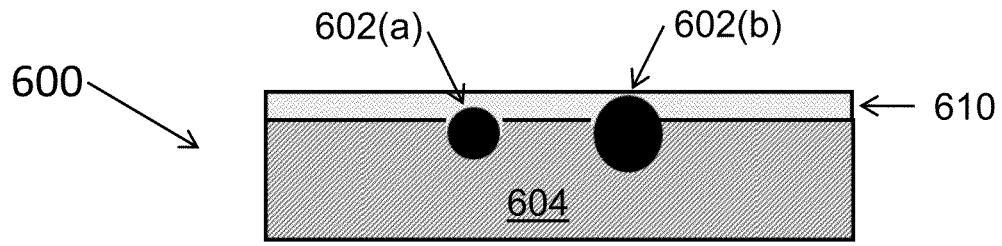

As shown in FIG. 6(e), following placement of the nano clusters 602(a) and 602(b) into the indentations 608, the surface of the substrate 604 and the nano clusters 602(a) and 602(b) is then covered by a layer 610 of an insulating material, such as a dielectric material. Any suitable, known dielectric material can be used for this layer. For example, a material such as silicon dioxide may be used for the layer 610.

Figure 6F:
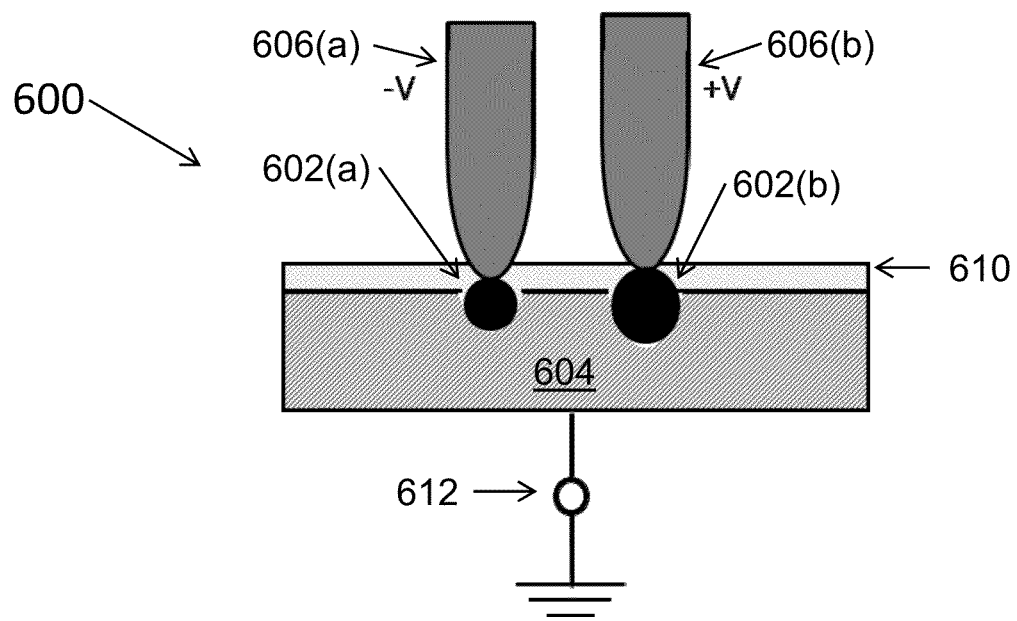

FIG. 6(f) schematically depicts elements of a nano TFET made in accordance with the process described with respect to FIGS. 6(a)-6(e), in operational mode, in which nanotips 606(a) and 606(b) are used to make electrical contact with the nano clusters 602(a) and 602(b), respectively, which form the source and drain, respectively of the nano TFET. A negative bias or ground 612 completes the electrical circuit to the nano TFET. Alternatively, electrical connections using nano metal wires can be formed to construct devices such as in FIG. 2 or 3.

Figure 7A:
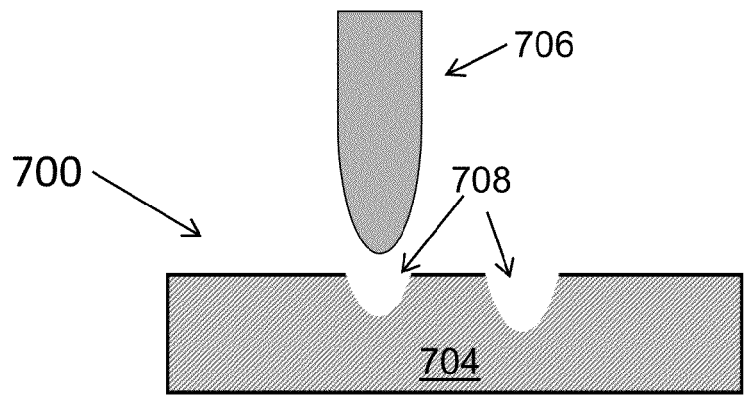
FIGS. 7(a)-7(c) are schematic cross-sectional views of a portion of a method of making a nano device in accordance with another embodiment of the invention.
Figure 7B:
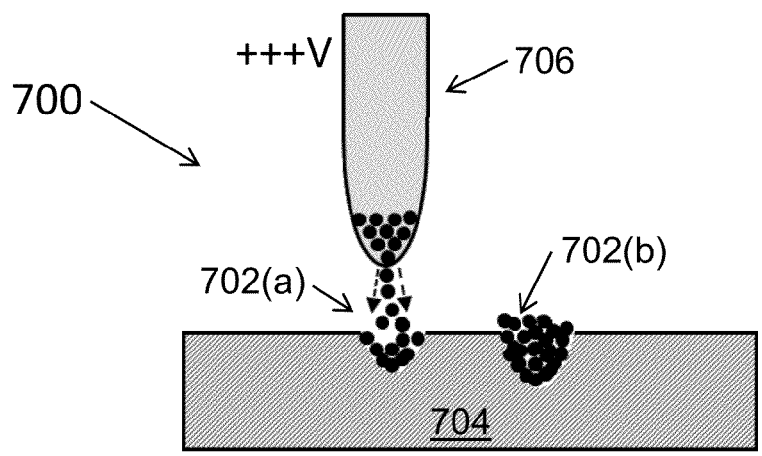
Figure 7C:
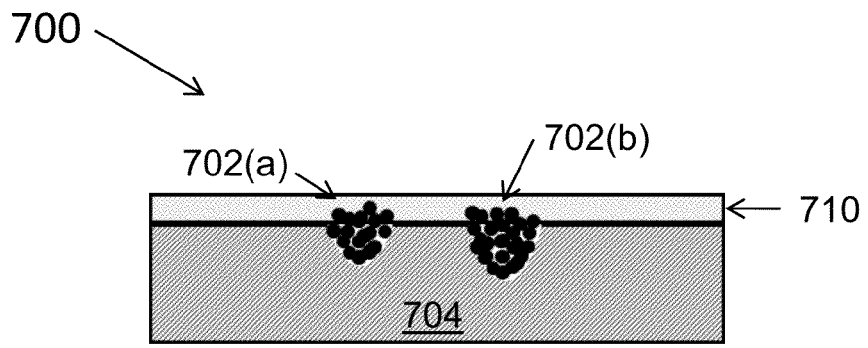

FIGS. 7(a)-7(c) are schematic cross-sectional views of a portion of a method of making the nano TFET in accordance with another embodiment of the invention. As schematically depicted in FIG. 7(a), similar to FIG. 6(b), a nanotip 706 may be used to form indentations 708(a), 708(b), in the surface of a n-doped semiconductor substrate 704. The indentations 708(a), 708(b) are essentially mechanically formed by the nanotip 706 being forced into the surface of the substrate 704. The size of the indentation may be controlled by movements and the size of the nanotip.

As schematically depicted in FIG. 7(b), a high positive voltage is applied to the nanotip 706, forming a high positive electric field, which results in evaporation of metal atoms from the nanotip 706 and transfer of the evaporated metal atoms to the indentations 708(a) and 708(b), to form nano clusters 702 (b) (already formed in FIG. 7(b)) and 702(a) (in the process of being formed in FIG. 7(a)). As shown, the thus-formed nano clusters 702(a), 702(b) are tightly packed, with the metal atoms in good contact both with each other and with the substrate. As will be understood, such good contact is important for proper functioning of the thus-formed devices. This method can also be used to deposit different metal atoms, or clusters of atoms, there were previously deposited on the nanotip or picked up by the nanotip from a different place.

As shown in FIG. 7(c), following placement of the nano clusters 702(a) and 702(b) into the indentations 708(a) and 708(b), the surface of the substrate and the nano clusters is then covered by a layer 710 of an insulating material, such as a dielectric material. Any suitable, known dielectric material can be used for this layer. For example, a material such as silicon dioxide may be used for the layer 710.

Following formation of the device to the point shown in FIG. 7(c), electrical connections can be formed, such as described above with respect to FIG. 6(f) or to form a device such as those depicted in FIG. 2 or 3.

Figure 8A:
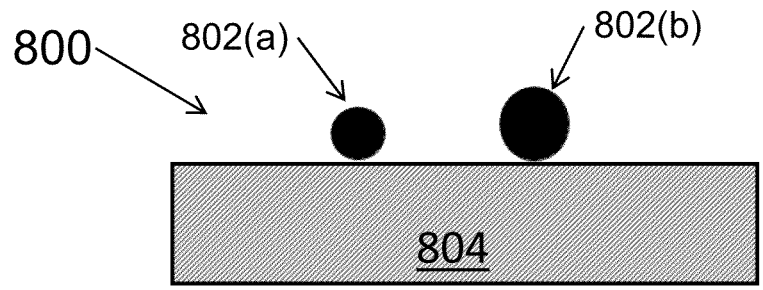
FIGS. 8(a)-8(c) are schematic cross-sectional views of a portion of a method of making a nano device in accordance with an embodiment of the invention.
Figure 8B:
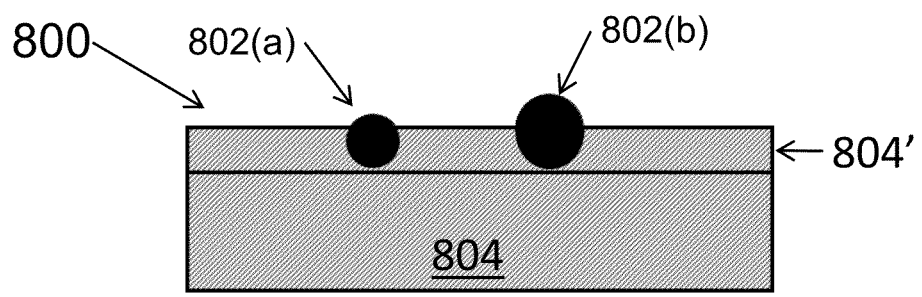
Figure 8C:
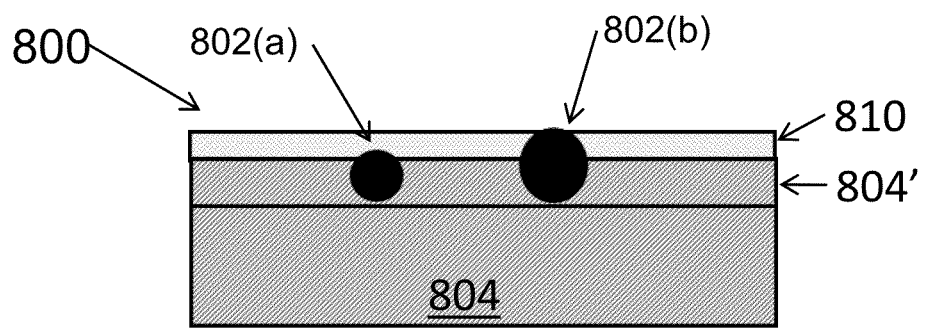

FIGS. 8(a)-8(c) are schematic cross-sectional views of a portion of a method of making a nano device 800 in accordance with another embodiment of the invention. As shown in FIG. 8(a), nano clusters 802(a) and 802(b) of metal atoms are deposited onto the clean surface of a n-doped semiconductor substrate 804, by a suitable method, such as one of those disclosed above. The deposited nano clusters 802(a), 802(b), may have different sizes, as noted above for example, for source and drain of a nano TFET, for example.

As schematically depicted in FIG. 8(b), additional n-doped semiconductor material layer 804' is deposited epitaxially by a suitable method to cover most of the nano clusters 802(a) and 802(b).

As shown in FIG. 8(c), following deposition of the additional n-doped semiconductor material layer 804' over most of the nano clusters 802(a) and 802(b), the surface of the substrate 804' and the nano clusters 802(a) and 802(b) is then covered by a layer 810 of an insulating material, such as a dielectric material. Any suitable, known dielectric material can be used for this layer. For example, a material such as silicon dioxide may be used for the layer 810.

Following formation of the device to the point shown in FIG. 8(c), electrical connections can be formed, such as described above with respect to FIG. 6(f), FIG. 7(c), or to form a device such as those depicted in FIG. 2 or 3.

Figure 9:
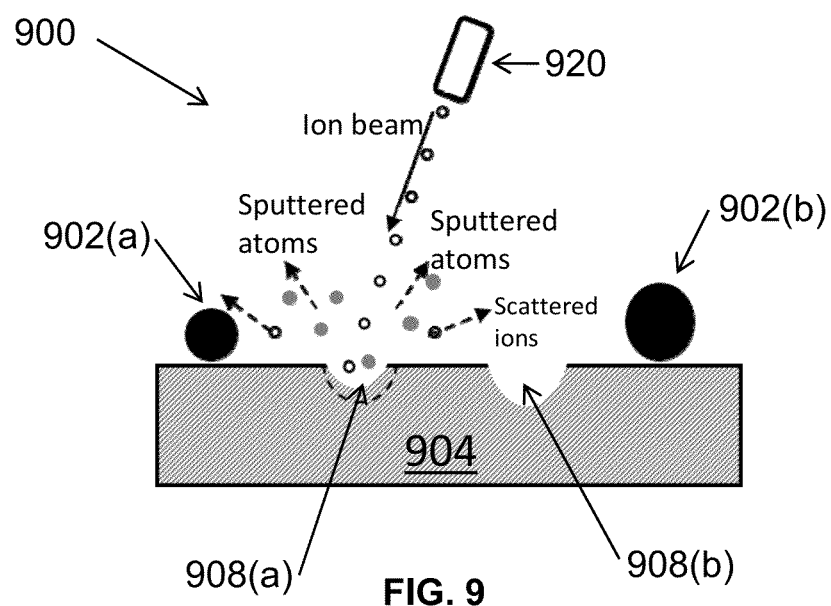
FIG. 9 is a schematic cross-sectional view of a portion of a method of making the nano device in accordance with another embodiment of the invention.

FIG. 9 is a schematic cross-sectional view of a portion of a method of making a nano device in accordance with another embodiment of the invention. As schematically depicted in FIG. 9, a focused ion beam (FIB) source 920 may be used to direct a beam of ions onto the surface of a n-doped semiconductor substrate 904, as a result of which atoms of the substrate 904 are sputtered away to form indentations 908(a) (in the process of being formed in FIG. 9) and 908(b) (already formed in FIG. 9). Ions from the FIB source are also scattered, as schematically depicted in FIG. 9. This provides an alternative method of forming the indentations 908(a) and 908(b), to the method shown in FIG. 6(b) and described above.

It is noted that in FIG. 9, nano clusters 902(a) and 902(b) are shown as already present on the substrate at the time the FIB source 920 is being used to form the indentations 908(a) and 908(b), but this is not necessarily the case—that is, the nano clusters 902(a) and 902(b) may be deposited onto the surface of the n-doped semiconductor substrate 904 subsequent to the formation of the indentations 908(a) and 908(b). The FIB patterning method for forming indentations can be used before or after the passivation layer is deposited.

It is noted that, throughout the specification and claims, the numerical limits of the disclosed ranges and ratios may be combined, and are deemed to include all intervening values. Furthermore, all numerical values are deemed to be preceded by the modifier "about", whether or not this term is specifically stated.

While the principles of the invention have been explained in relation to certain particular embodiments, and are provided for purposes of illustration. It is to be understood that various modifications thereof will become apparent to those skilled in the art upon reading the specification. Therefore, it is to be understood that the invention disclosed herein is intended to cover such modifications as fall within the scope of the appended claims. The scope of the invention is limited only by the scope of the claims.

REFERENCES

[1] http://newsroom.intel.com/docs/DOC-2032 (May 2011).
[2] G. D. J. Smit, S. Rogge, and T. M. Klapwijk, Appl. Phys. Lett. 81, 3852 (2002).
[3] S. Lee, C. M. Zetterling, M. Ostling, I. Aberg, M. Magnusson, K. Deppert, L. Wernersson, L. Samuelson, A. Litwin, Solid-State Electronics 46, 1433 (2002).
[4] S. M. Sze, Kwok K. Ng, "Physics of Semiconductor devices", John Wiley & Sons (2007), ISBN-13:978-0-471-14323-9.
[5] J. Q. Song, T. Ding, J. Li, Q. Cai, Surf. Sci. 604, 361 (2010).
[6] C. Joachim, D. Martrou, Moh'd Rezeq, C. Troadec, Deng Jie, N Chandrasekhar and S. Gauthier, "Multiple Atomic scale solid surface interconnects for atom circuits and molecule logic gates" J. Phys. Cond. Matter 22 084025 (2010).
[7] Moh'd Rezeq, Jason Pitters, and Robert Wolkow, "Nanotip fabrication by spatially controlled reaction with nitrogen", U.S. Pat. No. 7,431,856 (2008).

[8] Moh'd Rezeq, Christian Joachim, and N. Chandra, "Nanotip apex modification with atomic precision", Microelectronic Engineering 86, 996 (2009).
[9] V. T. Binh, S. T. Purcell, V. Semet, F. Feschet, Appl. Surf. Sci. 130-132, 803 (1998).
[10] H. S. Kuo, I. S. Hwang, T. Y. Fu, J. Y. Wu, C. C. Cheng, T. T. Tsong, Nano Lett. 4, 2379 (2004).

The disclosures of the foregoing references may be consulted for further understanding of terms used herein and are incorporated herein by reference.

The invention claimed is:

1. A nano semiconductor device, comprising:
a source and a drain, wherein each of the source and drain comprise a single implanted nano cluster of metal atoms, wherein the implanted nano cluster of metal atoms forming the source has an average radius in the range from about 1 to about 2 nanometers, and the implanted nano cluster of metal atoms forming the drain has an average radius in about the same range or larger.

2. The device of claim 1, wherein the source and the drain are separated by a distance from about 3 to about 5 nm.

3. The device of claim 1 wherein the device is a nano TFET or a nano switch.

4. The device of claim 1 further comprising additional source and/or drain and nano wiring appropriate to form a nano logic gate.

5. The device of claim 4 wherein the logic gate is one of an OR logic gate, an AND logic gate, or other types of logic gates or switches for nano electronic circuits.

6. A process for manufacturing a nano semiconductor device, comprising:
providing a moderate or low doped semiconductor substrate;
forming on a surface of the doped semiconductor substrate a plurality of nano clusters consisting of metal atoms, wherein the nano clusters consisting of metal atoms have a size in the range from about 1 to about 2 nanometers;
forming an indentation in the surface of the doped semiconductor substrate, the indentation having a size dimensioned to receive a single one of the nano clusters of metal atoms and to maintain physical contact between the nano clusters and the doped semiconductor substrate; and
transporting the single nano cluster consisting of metal atoms into the indentation by means of a nanotip probe.

7. The process of claim 6 wherein the nano clusters consisting of metal atoms are deposited on the semiconductor substrate by electron beam evaporation, by DC magnetron sputtering system or by an aerosol nano particle deposition technique.

8. The process of claim 6 wherein the nano clusters of metal atoms are formed on the semiconductor substrate by field evaporation of metal atoms from the nanotip probe.

9. The process of claim 6 wherein the forming the indentation is by impact of the nanotip probe on the surface of the semiconductor substrate.

10. The process of claim 6 wherein the forming the indentation is by a focused ion beam method.

11. The process of claim 6 further comprising passivating the surface of the semiconductor substrate by application of a passivating layer comprising oxygen, hydrogen or nitrogen thereover.

12. The process of claim 6 wherein the semiconductor substrate is n-doped, p-doped or is an intrinsic semiconductor.

13. The process of claim 6 wherein a plurality of indentations are formed on the surface, and pairs of nano clusters are separated by a spacing of about 3 nm to about 5 nm.

14. A process for manufacturing a nano semiconductor device, comprising:
providing a single doped semiconductor substrate;
forming an indentation in the surface of the doped semiconductor substrate, the indentation having a size dimensioned to receive a single nano cluster of metal atoms and to maintain physical contact between the nano cluster and the doped semiconductor substrate; and
applying a sufficiently high positive voltage to a nanotip to transport metal atoms from the nanotip itself into the indentation to form in the indentation the single nano cluster comprising the transported metal atoms.

15. The process of claim 14 wherein the forming the indentation is by impact of the nanotip probe on the surface of the semiconductor substrate.

16. The process of claim 14 wherein the forming the indentation is by a focused ion beam method.

17. The process of claim 14 further comprising passivating the surface of the semiconductor substrate by application of a passivating layer comprising oxygen, hydrogen or nitrogen thereover.

18. The process of claim 14 wherein the semiconductor substrate is n-doped, p-doped or is an intrinsic semiconductor.

19. A process for manufacturing a nano semiconductor device, comprising:
providing a doped semiconductor substrate;
forming on a surface of the doped semiconductor substrate a plurality of nano clusters of metal atoms, by applying a sufficiently high positive voltage to a nanotip to transport metal atoms from the nanotip itself onto the surface to form on the surface the plurality of nano clusters, each nano cluster comprising the transported metal atoms, wherein the nano clusters of metal atoms have an average radius in the range from about 1 to about 2 nanometers;
epitaxially depositing on the surface of the doped semiconductor substrate and around the nano clusters of metal atoms an additional layer of same-doped semiconductor material, to substantially cover the nano clusters of metal atoms.

20. The process of claim 19 further comprising passivating the surface of the additional layer of same-doped semiconductor material by application of a passivating layer comprising oxygen, hydrogen or nitrogen thereover.

21. The process of claim 19 wherein both the semiconductor substrate and the additional layer of semiconductor material are n-doped, p-doped or is an intrinsic semiconductor.

22. The process of claim 19 wherein pairs of the nano clusters are separated by a spacing of about 3 nm to about 5 nm.

* * * * *